United States Patent [19]
Toyoda et al.

[11] Patent Number: 6,043,649
[45] Date of Patent: Mar. 28, 2000

[54] MAGNETOMETRIC SENSOR USING A VOLTAGE STEP UP CIRCUIT AND A SQUID ELEMENT TO MEASURE A MAGNETIC FIELD

[75] Inventors: Haruhisa Toyoda; Tatsuoki Nagaishi; Hideo Itozaki, all of Hyogo, Japan

[73] Assignee: Sumitomo Electric Industries, Ltd., Osaka, Japan

[21] Appl. No.: 08/986,566

[22] Filed: Dec. 5, 1997

[30] Foreign Application Priority Data

Dec. 6, 1996 [JP] Japan ................................. 8-342804
Dec. 6, 1996 [JP] Japan ................................. 8-342805

[51] Int. Cl.[7] .......................... G01R 33/035; H01L 39/24
[52] U.S. Cl. ........................................ 324/248; 505/846
[58] Field of Search ........................ 324/248; 327/527; 505/845, 846

[56] References Cited

U.S. PATENT DOCUMENTS 5,387,864  2/1995  Gershenson et al. .................... 324/248

FOREIGN PATENT DOCUMENTS 62-44678  2/1987  Japan .
4-268471  9/1992  Japan .
7-84020   3/1995  Japan .
7-311250  11/1995 Japan .

OTHER PUBLICATIONS

Koch et al., "High performance superconducting quantum interference device feedback electronics" *American Institute of Physics* pp. 2968–2976 (1996).

*Primary Examiner*—Walter E. Snow
*Attorney, Agent, or Firm*—Foley & Lardner

[57] ABSTRACT

The present invention provides an improved and simplified voltage step-up circuit (2) for a SQUID magnetometric sensor (1), which provides step-up of a voltage signal generated by a SQUID element (11). The SQUID element is exited by a modulated signal using the FLL method. In an example, a step-up means (22) comprises only one step-up transformer (22T) working at room temperature and an electronic amplifier (22A). The voltage signal is first stepped up by the transformer. A signal processing means (23) processes the stepped up signal with the modulation signal to output a magnetic field measurement signal ($V\phi$). In another example, a bias current source (21) is also connected to terminals between SQUID element (11) and the transformer (22). A series resistor is connected between the transformer and one of the terminals. This allows a reduction in the number of terminals between the SQUID sensor (1) and the circuit (2).

8 Claims, 8 Drawing Sheets

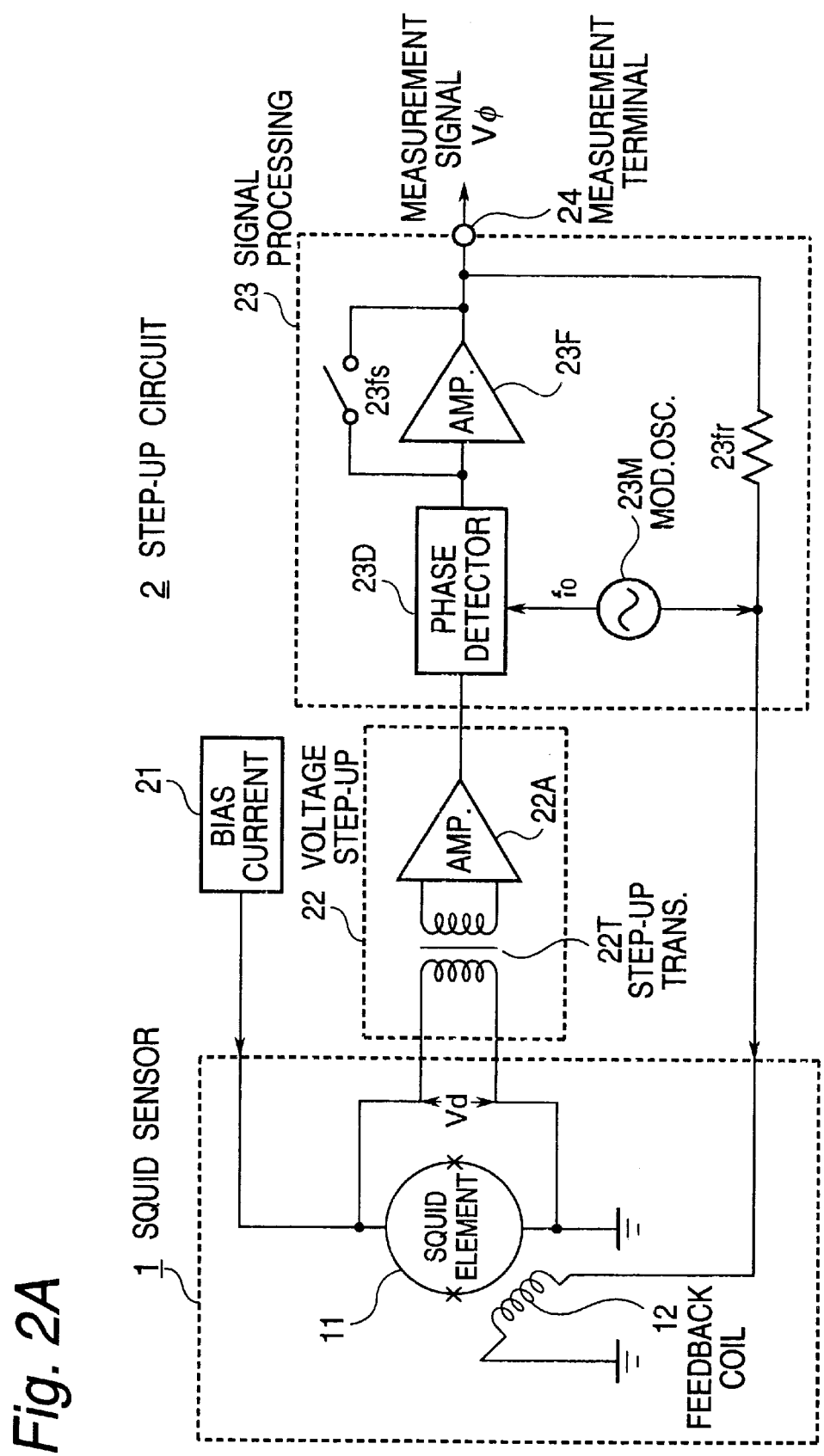

MAGNETOMETRIC SENSOR USING A VOLTAGE STEP UP CIRCUIT AND A SQUID ELEMENT TO MEASURE A MAGNETIC FIELD

BACKGROUND OF THE INVENTION

1. Field of the invention

The present invention relates generally to a circuit for operating a magnetometric sensor, and relates in particular to a voltage step-up circuit for a magnetometric sensor using a SQUID (superconducting quantum interference device), especially an oxide type of SQUID which is formed with a so-called "high-temperature superconductor".

2. Description of Related Art

It is well known that a SQUID is a highly sensitive magnetometric sensor which can measure very weak magnetic fields. If such a SQUID is formed with a high-temperature superconductor of the oxide type, the SQUID can operate at a relatively high temperature −196° C. of liquid nitrogen (N), and accordingly can be handled easily. Therefore, the system handling this type of SQUID is remarkably simplified in contrast to a system using liquid helium (He) at a very low temperature of −269° C., which is difficult to handle. Consequently, the high-temperature type of SQUID is expected to be developed and utilized in various applications, such as medical diagnosis, non-destructive examination, food inspection geological survey, and the like, and many researchers will research and actively develop applications of the SQUID. Thus, the inventors have proposed an invention named "a circuit device for driving a magnetometric sensor," provided with both functions of a SQUID magnetometer and a SQUID characteristic evaluator, in Japanese Patent Application No. 295758/1996, filed on Oct. 17, 1976.

Now, when a SQUID is used in measuring very weak magnetic fields, there is adopted a system with a so-called "FLL" (magnetic flux locked loop), for example, as shown in FIG. 1A, in the prior art. Namely, a SQUID sensor S filled with liquid helium or nitrogen is provided with a SQUID element E and a feedback coil FC, and a driving and processing circuit DP is provided with a bias current source B, a frequency modulation oscillator M, a phase detector PD and a feedback amplifier FA. A desired magnetic field measurement signal V$\phi$ representing an external magnetic field to the SQUID sensor S is outputted from the amplifier FA. In this case, a small voltage Vd generated by the SQUID element E is stepped up and amplified by a voltage step-up means SA including a first transformer $T_1$, a second transformer $T_2$ and an amplifier A. The first transformer $T_1$, so-called "superconducting transformer," is placed within the SQUID sensor S and operates at a low temperature, for example, at a very low temperature −269° C. of liquid helium (He) or at a relatively high temperature −196° C. of liquid nitrogen (N), while the second transformer $T_2$ and the amplifier A operates at room temperature.

In FIG. 1A, the SQUID element E responds to an external magnetic field to be measured, and thereby generates the small voltage Vd. This voltage Vd is once stepped up to a predetermined value by the first transformer $T_1$ in liquid helium or nitrogen within the SQUID sensor S, and then the stepped up voltage is picked up on the exterior of the sensor S. The stepped up voltage is isolated from the following stages and further stepped up by the second transformer $T_2$ at room temperature. In the prior art, the SQUID voltage Vd is stepped up by the voltage step-up means SA ranged between the interior and the exterior of the SQUID sensor S to be processed thereafter by the phase detector and the following stages thereof.

Thus, there is no risk that an external noise enters the small voltage Vd or that the variation of temperature affects adversely the first transformer, because the first transformer $T_1$ acting as the first stage of the voltage step-up means SA is within the SQUID sensor S and under a certain constant temperature condition.

However, in this case, the first transformer $T_1$ must be formed with expensive materials fitted for a very low temperature, and the size of the SQUID sensor S must be large because transformer $T_1$ is incorporated within the sensor S. Further, as the core material of the first transformer $T_1$ is cooled to a very low temperature, this degrades its magnetic permeability, and the transformer $T_1$ cannot achieve desired performance. Furthermore, the use of two transformers $T_1$ and $T_2$ naturally requires consideration of matching between these transformers, and the like. Therefore, these problems present great difficult matters that prevent the SQUID from utilization in a magnetometric sensor.

In addition, the above system in the prior art requires many terminals as shown in FIG. 1B. FIG. 1B shows a schematic block diagram of the same magnetometric sensor system as FIG. 1A, and consequently the identical numerals indicating the same elements between FIGS. 1A and 1B are used, but FIG. 1B illustrates, in partial detail, terminals and wirings between a SQUID sensor S and a driving and processing circuit DP.

In FIG. 1B, a bias current source circuit B supplies a bias current signal through bias current output terminals $tb_1$ and $tb_2$ to a SQUID element E, the SQUID element E generates a small voltage signal Vd responding to an external magnetic field to be measured, and a first transformer $T_1$ steps up once the voltage signal Vd to a predetermined value and sends out the stepped up voltage signal as a voltage detection signal through detection signal input terminals $td_1$ and $td_2$ to the exterior of the SQUID sensor S. Thus, these four signal terminals $tb_1$, $tb_2$, $td_1$ and $td_2$ relay signals between the SQUID sensor S and the driving and processing circuit DP.

In addition, such a feedback amplifier sends a feedback signal mixed with a frequency modulation signal from an oscillator M through feedback terminals $tf_1$ and $tf_2$ to a feedback coil FC within the SQUID sensor S, and therefore, the circuit DP requires further two feedback terminals $tf_1$ and $tf_2$, six terminals in all, for one SQUID sensor.

Thus, in the prior art, it is necessary for a driving and processing circuit to prepare at least four signal terminals for one SQUID element, that is, to adopt a circuit structure of a type to be called as "four terminals manner." These terminals include a first set of two output terminals $tb_1$ and $tb_2$ for supplying a bias current signal to the SQUID element, and a second set of two input terminals $td_1$ and $td_2$ for picking up a voltage detection from the SQUID element. Further, if feedback terminals $tf_1$ and $tf_2$ are included, the circuit requires six signal terminals for one SQUID sensor. Accordingly, in the prior art, there are also disadvantages that a large number of terminals and wirings are required for transmitting and receiving signals between a SQUID sensor and a driving and processing circuit, and correspondingly a large quantity of liquid helium or nitrogen tend is likely to evaporate our of the SQUID sensor.

SUMMARY OF THE INVENTION

An object of the present invention is generally to provide a voltage step-up circuit for a magnetometric sensor which can resolve all the various difficult problems and inconveniences owing to incorporating a first transformer within a SQUID sensor. The present invention improves, in particular, a voltage step-up means for step-up transforming a small voltage generated by a SQUID element used as a magnetometric sensor, without requiring that the sensor contains a transformer, so as to simplify its structure, as well as without requiring consideration of die degradation of the magnetic permeability of transformer core materials and the matching between transformers.

Another object of the present invention is to provide a voltage step-up circuit for a magnetometric sensor which can further overcome the above disadvantages owing to having many terminals and wirings between a SQUID sensor and the step-up circuit. The present invention further improves the voltage step-up circuit to reduce terminals and wirings between the sensor and the circuit to further simplify its structure, as well as to reduce the quantity of a cooling medium, such as liquid helium or nitrogen.

According to one feature of the present invention, the above and other objects are achieved by a voltage step-up circuit for a SQUID magnetometric sensor for providing step-up and processing of a voltage signal generated by a SQUID element used as a magnetometric sensor with modulated excitation on the basis of a modulation signal, comprising:

a voltage signal step-up means comprising a step-up transformer for receiving said voltage signal from the SQUID element and step-up transforming said voltage signal, and an electronic amplifier for amplifying the step-up transformed, and a signal processing means for processing the amplified signal from said voltage signal step-up means on the basis of the modulation signal to output a magnetic field measurement signal.

The present invention starts from the idea of overthrowing bravely the common knowledge that a first step-up transformer of a SQUID element output voltage should be placed within a SQUID sensor at a very low temperature, and uses the idea of placing the step-up transformer outside the SQUID sensor and it room temperature, which no one has thought of until now. Briefly, the present invention proposes a simple solution of placing only one step-up transformer for a SQUID output in the first input stage of a SQUID driver circuit. Thereby, the present invention can solve all of the above difficult problems.

In fact, the Inventors, on the basis of these ideas, have heavily tested SQUID driver circuits under various conditions, in which step-up transformers placed at room temperature directly receive the outputs generated by SQUID elements that were formed with high-temperature superconductors of oxide types and used at −196° C. as magnetometric sensors. As a result, it was confirmed that the voltage fluctuations and noise ratios of these transformers output are negligibly small to complete the present invention as defined in the Claims.

Therefore, the present invention allows the structure of a SQUID sensor to be remarkably simplified and small-sized, because it is not necessary for the SQUID sensor to contain a step-up transformer. For example, in the practical stage of measuring the distribution of very weak magnetic fields using SQUID sensors, a large number of SQUID sensors, for example, tens to hundreds, or even thousands depending on the applications, must be located within the area to be measured, and to process a large number of outputs from these sensors with multi-channel communication. In this case, according to the present invention, as these many SQUID sensors do not require to contain step-up transformers and are thereby made very small, it is very easy to arrange these sensors with high density.

Further, in the present invention, as a step-up transformer is not placed within a sensor, it is not necessary that the core material of the transformer should be used at very low temperature which will degrade its magnetic permeability, and it is also very easy to chance the specifications, such as turn ratio and materials, as required, and one can cope flexibly with various design changes.

Furthermore, in contrast with the use of two transformers in the prior art, the present invention uses only one step-up transformer working at room temperature in a first stage of a driver circuit with the capability of performing the functions of the two transformers. Accordingly, it is not necessary to consider matching between these transformers, and the like. According to another feature of the present invention, the single transformer has the capability of not only performing voltage step-up function, but can also act as a high-pass filter to effectively pass high-frequency components, as explained hereinafter.

According to another feature of the present invention, the above and other objects are achieved by a voltage step-up circuit for a magnetometric sensor including a bias current source for supplying a bias current to a SQUID element used as a magnetometric sensor and a step-up transformer for stepping up a voltage signal generated by the SQUID element, wherein:

said bias current source is electrically connected to two terminals for receiving a voltage signal across the SQUID element;

said step-up transformer is electrically connected through a series resistor between the two terminals; and the resistance value of said series resistor is selected so as not to saturate the core of said step-up transformer.

According to this feature of the present invention, one step-up transformer is provided on the first stage in the voltage step-up circuit, the terminals are allowed to not only output the bias current from the bias current source but also to input the voltage signal from the SQUID element, and the resistor having a predetermined value is connected between one of the terminals and the transformer. Accordingly, this further simplified circuit structure leads to the great advantages of reducing by half the number of terminals and wiring to the SQUID, correspondingly reducing also the quantity of a cooling medium, such as liquid helium or nitrogen, and consequently increasing the cooling effect of the SQUID.

In the practical stage of preparing a large number of SQUID sensors as above mentioned, according to the present invention, the reduction of the number of wirings to the many SQUID sensors without containing step-up transformers makes their arrangement with multi-channel further easy and simplified.

The above and other objects, features and advantages of the present invention will be apparent from the following description of preferred embodiments of the present invention with reference to the accompanying drawings.

BRIEF DESCRIPTION OF THE DRAWINGS

FIG. 2A shows a schematic circuit block diagram of a voltage step-up circuit according to a first embodiment of the present invention;

DETAILED EXPLANATION OF THE INVENTION

First Embodiment

Figure 1A:
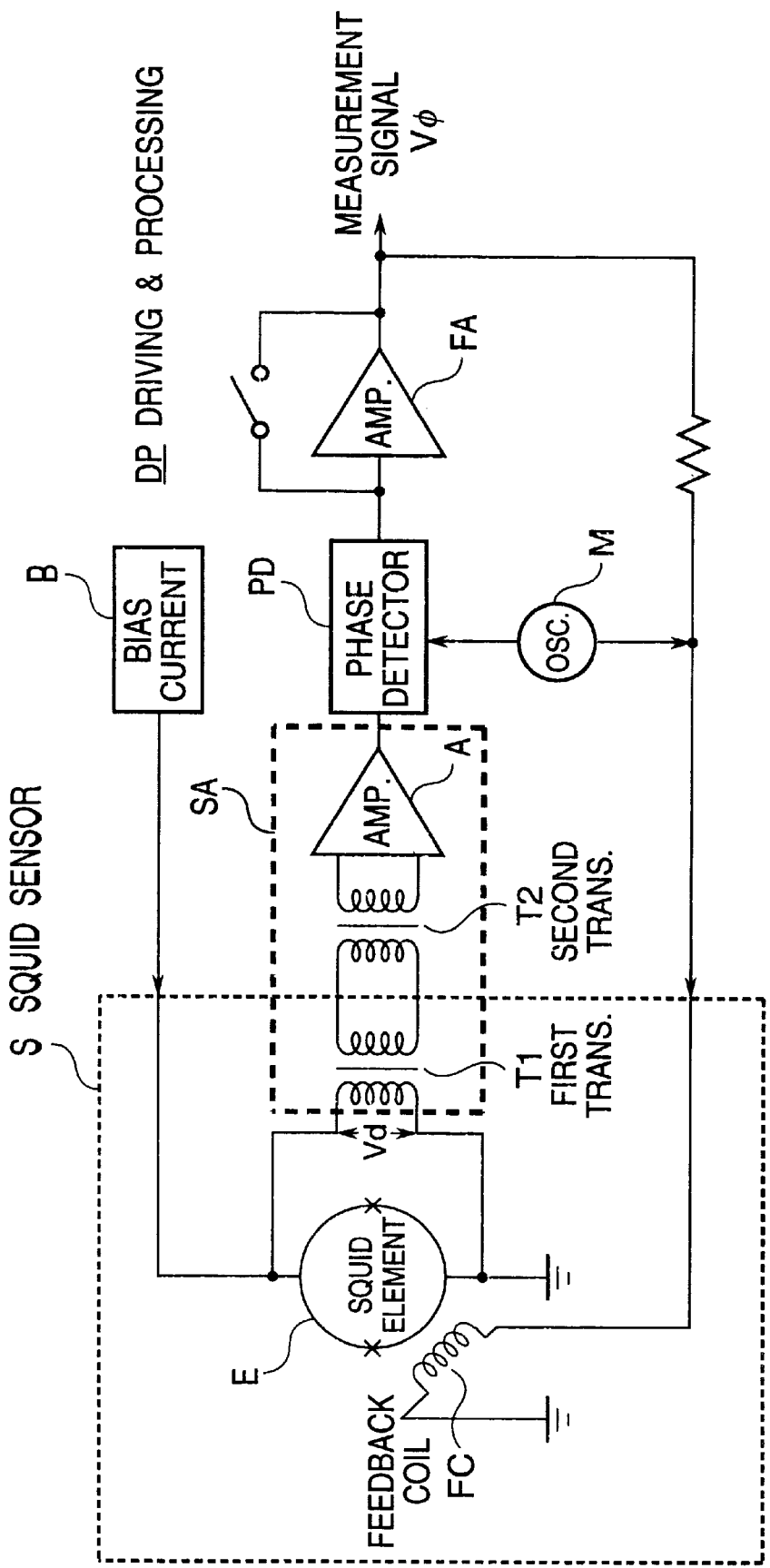
FIG. 1A, as explained hereinbefore, shows a schematic block diagram of a magnetometric sensor system in the prior art.

Referring to FIG. 2A, there is shown a voltage step-up circuit 2 for a SQUID magnetometric sensor 1 according to a first embodiment of the present invention. The magnetometric sensor 1 is provided with a SQUID element 11 and a feedback coil 12, and circuit 2 is provided with a bias current source circuit 21, a voltage signal step-up means 22 and a signal processing means 23.

The SQUID element 11 is, for example, an oxide type of high-temperature superconducting SQUID in which a thin film of HoBaCuO is formed on a substrate of SrTiO3. The heart of the SQUID element is superconducting junction which is formed by depositing the superconducting thin film on the substrate having a step of 0.2 $\mu$m (micrometers). This kind of SQUID element has advanced performance of high resolution, for example, one fifty-millionth ($2\times10^{-8}$) of the earth magnetism.

When the SQUID element 11 is used as a magnetometric sensor, it is placed in liquid nitrogen to operated in a temperature ambience of −196° C. together with the feedback coil 12. For example, the feedback coil 12 is formed on the substrate with a conductor tin film of only one turn to contribute to the simplification of the SQUID sensor construction. Additionally, the feedback coil, in operation, receives an exciting signal from the processing circuit 23, and applies a certain modulated magnetic field and a feedback magnetic field to the SQUID element 11 based on the detection result of a voltage Vd detected by the SQUID element.

The voltage step-up circuit 2 is an electronic circuit which drives the SQUID sensor 1 and processes a voltage signal representing the detected voltage Vd from the SQUID element 11, using the means 21 to 23 forming a magnetic flux modulation type of magnetic flux locked loop, so-called "FLL." The bias current source circuit 21 produces an AC bias current having a relatively low frequency $f_1$, for example, 1 kHz, or a certain DC bias current to supply the bias current. The voltage signal step-up means 22 steps up and amplifies the detected voltage signal Vd. Also, the signal processing means 23 includes an oscillator circuit 23M for generating a modulation signal, a phase detector 23D, a feedback integrating amplifier circuit 23F, and the like.

The oscillator circuit 23M generates the modulation signal of a relatively high frequency $f_0$, for example, 1 kHz, and accordingly excites the feedback coil 12 depending on this modulation signal to apply a certain magnetic field to the SQUID element. The phase detector 23D detects a stepped up voltage signal from the step-up means 22 on the basis of the modulation signal. In addition, the feedback integrating amplifier circuit 23F, having an integration function and reset by a reset switch 23fs, excites the feedback coil 12 through a feedback resistor 23fr depending on the detection of the detected voltage Vd to apply the feedback magnetic field to the SQUID element 11.

This circuit of FLL type uses a null method technology, as well known. Namely, the feedback integrating amplifier 23F feedbacks the exciting current corresponding to the detected voltage signal Vd to the feedback coil 12, thereby the feedback coil 12 applies the feedback magnetic field to the SQUID element 11 to cancel an external magnetic field to be measured, and consequently the operating point of the SQUID element 11 is automatically null-balanced to be locked at a trough or crest point of a SQUID voltage (V) vs. magnetic flux ($\Phi$) characteristics curve. Therefore, the exciting signal produced by the feedback integrating amplifier 23F represents the external magnetic field to make a desired magnetic field measurement signal V$\phi$ appear on a measurement output terminal 24, with the above FLL function.

Now, according to the present invention, the voltage signal step-up means 22 includes a step-up transformer 22T and an electronic amplifier 22A, in which the transformer 22T isolates electrically its input stage from the following stages and steps up the detected voltage Vd to a required voltage of a certain multiples of the voltage Vd, and the amplifier 22A amplifies the stepped up voltage to obtain a signal to be processed.

The step-up transformer 22T has, for example, a ferrite core wound with primary and secondary windings in a predetermined turn ratio, for example, a selected value between several and hundreds, depending on the specification of the SQUID element and the amplifier 22A. It is already confirmed by the Inventors that the step-up transformer 22T has the voltage fluctuation and noise ratio negligibly small and has no problems in practice, though it is placed remotely from the SQUID element 11 and at variable room temperature.

Another consideration is that thermal noise owing to a resistance component is generally proportional to the absolute temperature (K). Here, as contrasted with a sensor structure containing a step-up transformer in the prior art in which it might be considered to have used a usual SQUID operating at 4 K=−269° C. or below, a SQUID element of an oxide type of high-temperature operates, for example, at 77 K=−196° C., in the present invention. Accordingly, a detected voltage generated by this SQUID element in the present invention has already included the thermal noise component four times the thermal noise of the usual SQUID [$4\approx(77/4)^{1/2}$] in the prior art. Thus, it can be considered that a step-up transformer, though remote from the sensor and placed at room temperature, does not exert such an effect on the detected voltage as a noise source, and accordingly the step-up transformer can work effectively though placed on the side of a SQUID driver circuit at room temperature with no obstacles in practice.

High-pass Filter Function

The step-up transformer performs not only the above voltage step-up but also a high-pass filter function for passing effectively high-frequency components by selecting its circuit constants of suitable values. The high-pass filter function is explained as follows.

In the voltage step-up circuit 2 processing signals with magnetic flux modulation, the detected voltage signal Vd generated by the SQUID element 11 includes a high-frequency component $f_0$ of the modulation signal generated by the oscillator circuit 23M. The voltage signal Vd is stepped up by the transformer 22T and amplified by the amplifier 22A in the voltage signal step-up means 22, and further sent to the signal processing means 23 to pick up only a desired component of the frequency $f_0$.

Now, if the bias current source circuit 21 produces an AC bias current having a component of a predetermined frequency, for example $f_1$, to the SQUID element, the voltage signal Vd generated by the clement 11 includes the component of the frequency $f_1$. In particular, when the AC bias current has the wave shape which is rectangular, the voltage signal includes harmonic components of frequencies $nf_1$. Therefore, it is very useful to filter the component of the frequencies $nf_1$ as well as the frequency $f_1$. In the view of this point, the circuit according to the present invention can be constructed to eliminate the components of these frequencies $f_1$ and $nf_1$ by selecting suitable circuit constants of the step-up transformer 22T.

Figure 3:
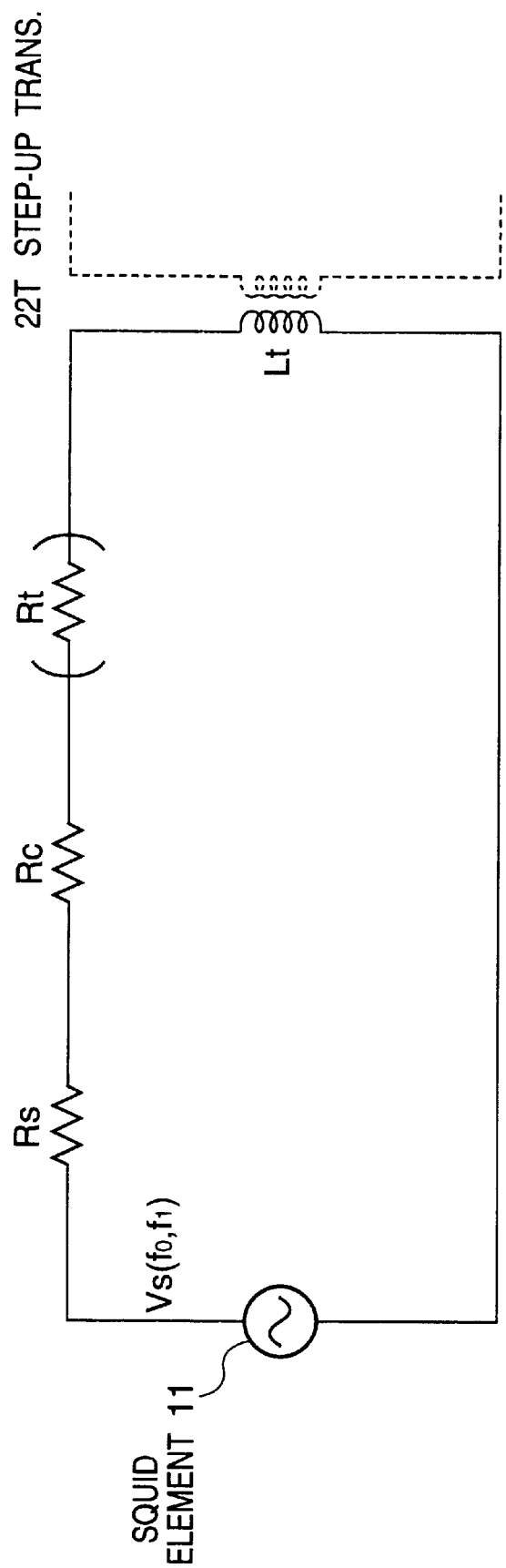
FIG. 3 shows an equivalent circuit to the circuit between a SQUID element and a step-up transformer in FIG. 2.

Here, assuming that the internal resistance of the SQUID element 11 is represented by Rs, the circuit resistance between the SQUID element 11 and the step-up transformer 22T is represented by Rc, the internal resistance of the step-up transformer 22T is represented by Rt, the coil inductance of the transformer 22T is represented by Lt, and the resistance Rt of the transformer 22T is sufficiently smaller than the resistances Rs and Rc, the circuit comprising the SQUID element 11 and the step-up transformer 22T is illustrated by an equivalent circuit of FIG. 3. As shown in this equivalent circuit, it is understood that the transformer 22T is allowed to act also as a high-pass filter, the cut-off frequency fc of this filter is given by the following:

$$fc=(Rs+Rc)/(2\pi Lt). \quad (1)$$

Therefore, the coil inductance Lt is given by the following:

$$Lt=(Rs+Rc)/(2\pi fc). \quad (2)$$

In the present invention, the cut-off frequency fc is selected in the region as follows:

$$f_0 > fc \gg f_1, \quad (3)$$

to determine a desired value of the coil inductance Lt of the set-up transformer 22T. In the example of $f_0$=40 kHz and $f_1$=1 kHz as shown in FIG. 2A, the value of the cut off frequency fc, for example, fc=10 kHz, is selected according to equation (3) and a desired coil inductance Lt is obtained by equation (2) based on this value of fc and given resistance values Rs and Rc.

In addition, when the output voltage Vd of the SQUID element 11 has noises of sufficiently lower frequencies than the modulation signal frequency $f_0$, these noises are efficiently eliminated by the above high-pass filter function of the step-up transformer 22T. Therefore, the high-pass filter acts effectively on low frequency noise included in the SQUID output voltage Vd, both in the case of DC current bias as well as the above AC bias current of frequency $f_1$.

Applied Example

The step-up circuit according to the first embodiment of the present invention allows relieving the designing and fabricating of magnetometric sensors from various restrictions owing to using a first step-up transformer within a narrow SQUID sensor at a very low temperature, and accordingly provides a magnetometric sensor that is inexpensive and easy to handle. Therefore, the present invention is applicable to various technical fields.

Figure 4:
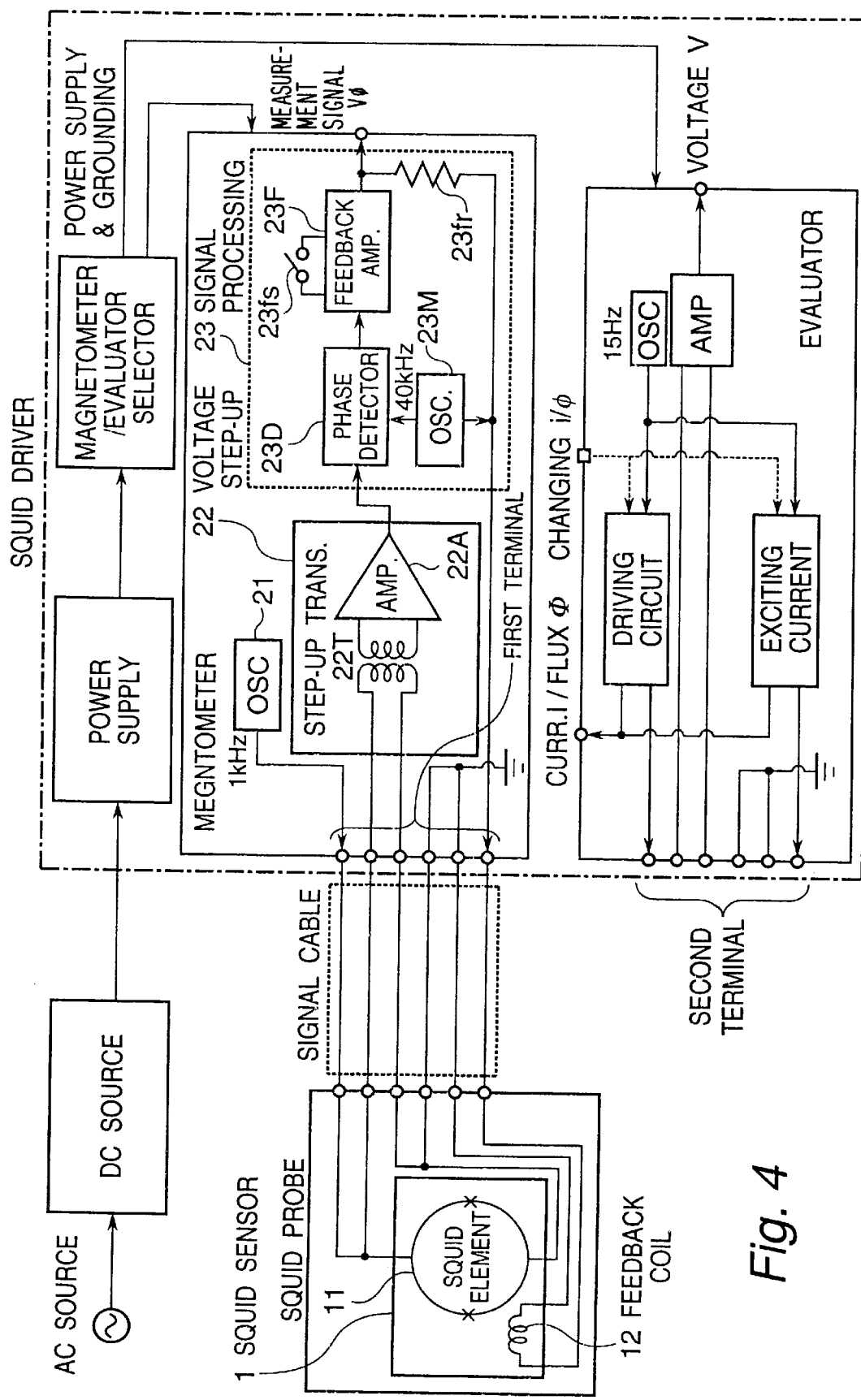
FIG. 4 shows a schematic circuit block diagram of an example of applying a SQUID voltage step-up circuit according to the first embodiment of the present invention.

In FIG. 4, there is shown a schematic circuit block diagram of a SQUID driver, as an example of applying a step-up circuit according to the present invention, in which the step-up circuit is applied to a magnetometer in "a circuit device for driving a magnetometric sensor" of the above mentioned Japanese Patent Application. In this example, the above mentioned advantages are provided.

Additionally, the SQUID driver circuit of FIG. 4 has mainly the magnetometer for driving a SQUID element 11 as a magnetometric sensor and obtaining a magnetic field measurement signal Vφ to determine an external magnetic field, and an evaluator for obtaining a current or magnetic flux signal I or Φ depending on the changing operation "i/φ" to estimate SQUID characteristics, such as V-Φ and V-I characteristics. In this circuit, a feedback coil 12 within a SQUID sensor 1 is also used as a magnetic field applied when the evaluator is selected. The SQUID driver circuit allows mainly to perform either a magnetometer function or an evaluator function by changing their power supply depending on a selector. For its details, please see the above description.

Second Embodiment

Figure 2B:
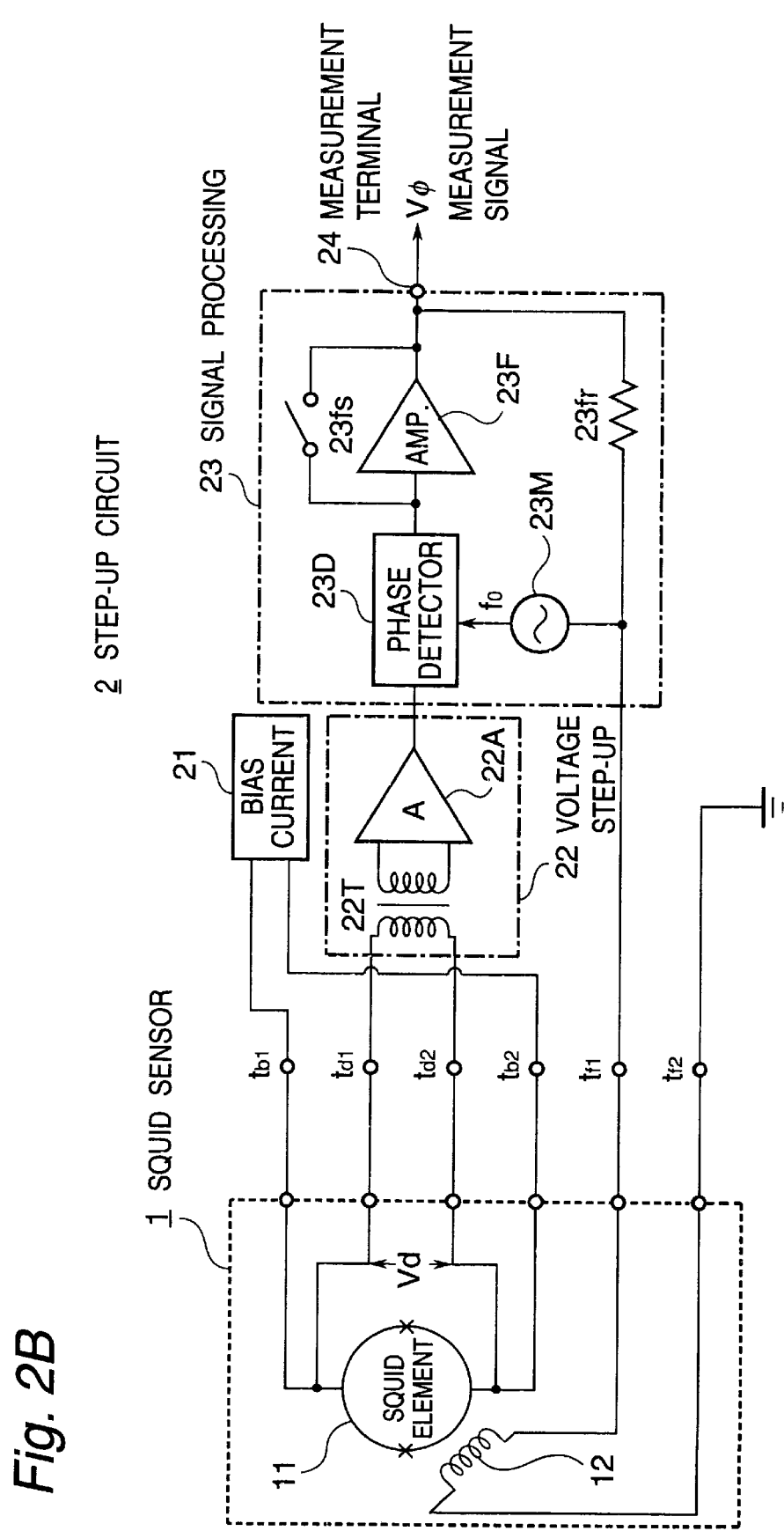
FIG. 2B shows also a schematic circuit block diagram of a voltage step-up circuit according to the first embodiment of the present invention, and illustrates in partial detail wirings to a SQUID sensor.

Even the above voltage step-up circuit according to the first embodiment of the present invention requires many terminals as shown in FIG. 2B. FIG. 21 shows in partial detail a schematic block diagram of the same voltage step-up circuit as FIG. 2A, consequently the identical numerals indicating the same elements between FIGS. 2A and 2B are used, but FIG. 2B also illustrates the terminals and wirings of a voltage step-up circuit 2 to a SQUID magnetometric sensor 1 in detail.

Figure 1B:
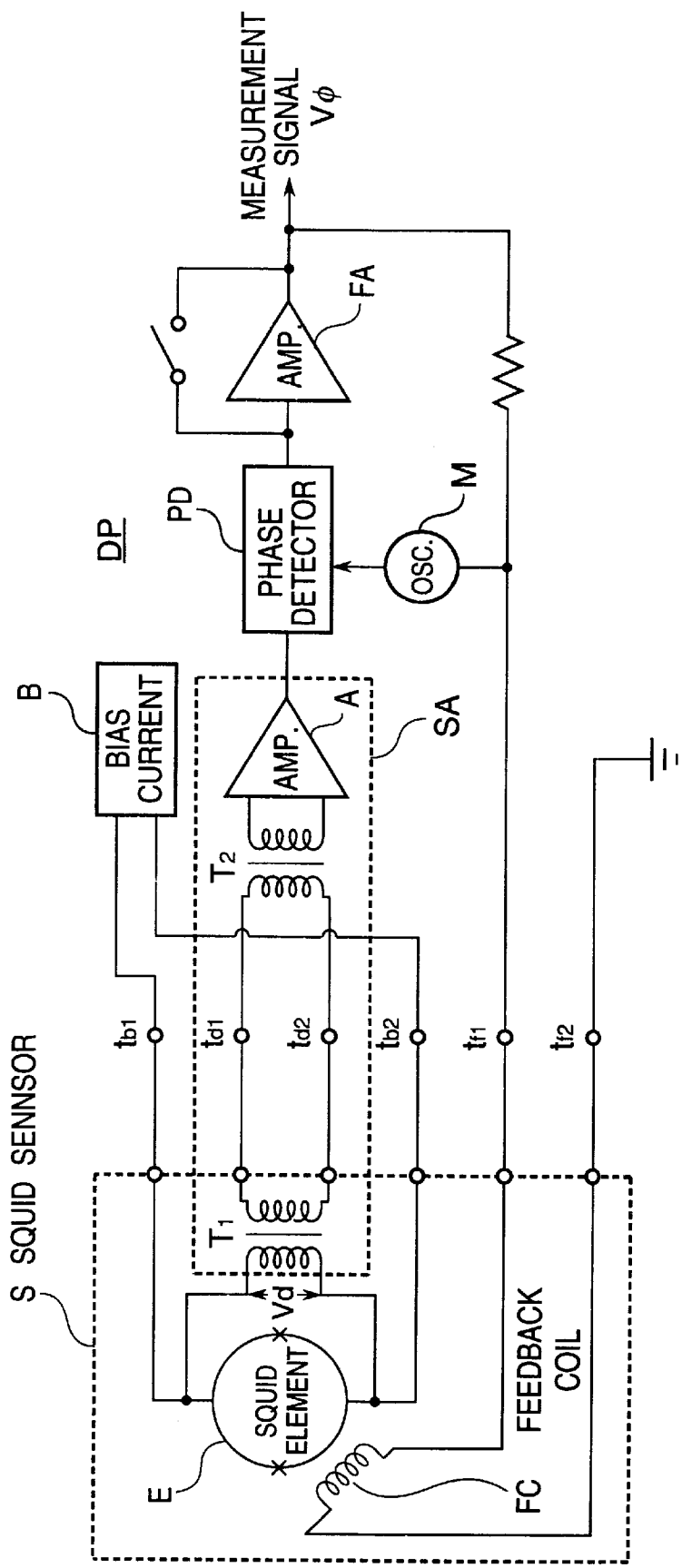
FIG. 1B, as explained hereinbefore, shows also a schematic block diagram of a magnetometric sensor system in the prior art, and illustrates in partial detail wirings between a SQUID sensor and its driver circuit.

As shown in FIG. 2B, it is easily understood that the voltage step-up circuit requires at least four signal terminals $tb_1$, $tb_2$, $td_1$ and $td_2$ for one SQUID element, further two signal terminals $tf_1$ and $tf_2$ if considering magnetic feedback, similarly to the system shown in FIG. 1B. To alleviate this problem, according to a second embodiment of the present invention, these four or six signal terminals and wirings for one SQUID sensor are effectively reduced in half, the quantity of a cooling medium is also reduced correspondingly, and consequently the cooling effect of the SQUID is increased.

Figure 5:
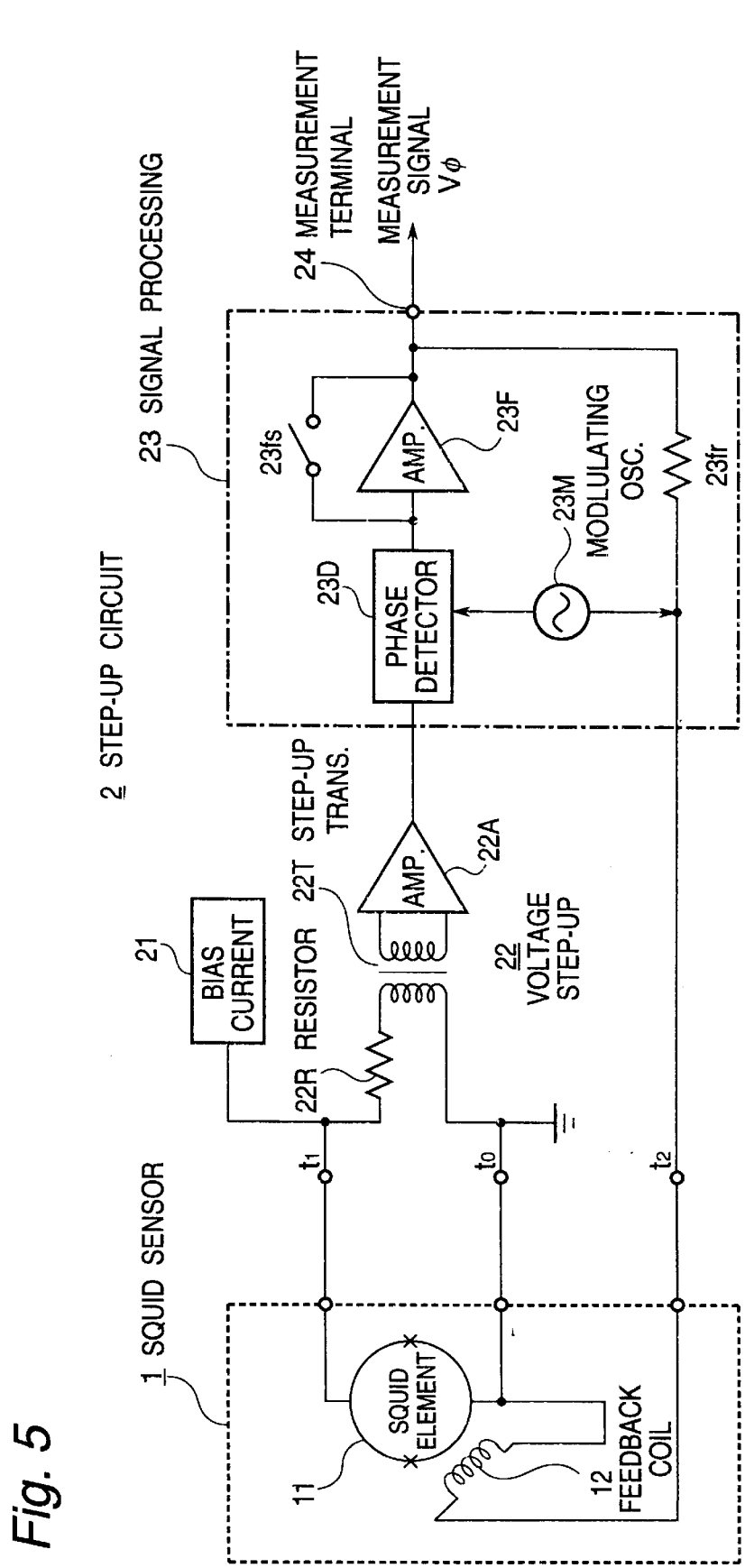
FIG. 5 shows a schematic circuit block diagram of a step-up circuit according to a second embodiment of the present invention.

Now, FIG. 5 shows a schematic circuit block diagram of a voltage step-up circuit according to the second embodiment of the present invention. A SQUID magnetometric sensor I is provided with a SQUID element 11 and a feedback coil 12. On the other hand, a voltage step-up circuit for driving the SQUID sensor 1 and processing signals is provided with a bias current source circuit 21, a voltage signal step-up means 22 including a step-up transformer 22T, and a signal processing means 23. This voltage step-up circuit 2 is also provided with a signal input/output terminal $t_1$, a common potential terminal $t_0$ and a feedback exciting terminal $t_2$ in order to transmit/receive signals to and from the SQUID sensor 1. The common terminal $t_0$ is electrically connected commonly at least to each one of the current outputs of the bias current source 21, the primary inputs of the step-up transformer 22T and outputs of the feedback stage in the signal processing means 23. A common reference potential, for example, the ground potential or a base board potential is applied to the terminal $t_0$ and these inputs and outputs.

In the SQUID sensor, the SQUID element 11 and the feedback coil 12 are formed by the technique similar to that mentioned above, and placed in conditions similar to those mentioned above. However, they are electrically connected to the terminals $t_0$, $t_1$ and $t_2$ with only three wiring conductors of, for example, signal cable. Namely, each one end of the SQUID element 11 and the feedback coil 12 is commonly connected to the common potential terminals $t_0$ with the first conductor, and the other end of the element 11 is connected to the signal input/output terminals $t_1$ with the second conductor. The other end of the coil 12 is connected to the feedback exciting terminals $t_2$ with the third conductor for receiving a feedback exciting signal from the feedback stage of the signal processing means 22 to apply a corresponding magnetic field to the element 11.

The voltage step-up circuit 2 is formed as a magnetometer circuit with FLL to drive the SQUID sensor and to step up and process a detected voltage signal Vd representing a voltage generated by the SQUID element 11, as already explained.

The bias current source circuit 21 produces an AC bias current having a relatively low frequency, for example, 1 kHz, or a certain DC current between its outputs connected electrically to the terminals to and $t_1$, in order to supply the bias current to the SQUID element 11

The voltage signal step-up means 22 includes the step-up transformer 22T and an electronic amplifier 22A. The transformer 22T is connected between the terminals $t_1$ and $t_0$ through a resistor 22R having a predetermined value as explained in details hereinafter, in order to step up effectively the detected voltage signal Vd from the SQUID element 11 to a predetermined multiples of the signal Vd. The amplifier 22A further amplifies the stepped up signal to a suitable value to be processed by the following stages.

The signal processing means 23 includes an oscillator 23M, a phase detector 23D, a feedback integrating amplifier 23F, and the like, in order to process the stepped up and amplified signal to obtain a magnetic flux measurement signal Vφ on a measurement terminal 24, with the FLL function, as explained in detail hereinbefore in connection with FIG. 2A. Consequently, the identical numerals indicate the same elements between FIGS. 2A and 5. But, in FIG. 5, outputs of a feedback stage of the processing means 23 are electrically connected to the terminals $t_2$ and $t_0$ in order to apply a modulated feedback exciting signal between terminals $t_2$ and $t_0$ depending on the feedback quantity based on the voltage detection signal Vd and the modulation by a modulation signal having a relatively high frequency $f_0$.

Additionally, the step-up transformer 22T is also the same as the first embodiment, and accordingly many advantages of the first embodiment can be obtained as explained hereinbefore.

Here, in the voltage step-up circuit according to the second embodiment of the present invention, the outputs of the bias current source circuit 21 are electrically connected to the signal input/output terminal $t_1$ and the common terminal $t_0$ to supply the bias current to the SQUID element 11, and the primary inputs of the step-up transformer 22T are also connected to these terminals $t_1$ and $t_0$ to receive the detected voltage signal Vd from the SQUID element 11 through the series resistor 22R, as above mentioned. The resistance value of the series resistor 22R is selected so as not to saturate the core of the step-up transformer 22T, depending on the inner resistance of the transformer 22T and wiring resistance of the signal cable. Accordingly, the value is relatively small, for example, about 1Ω. This allows use of a circuit structure of a type called "two terminal manner," that is, one set of two terminals $t_1$ and $t_0$ providing both functions of bias current supplying and SQUID voltage receiving.

Figure 6A:
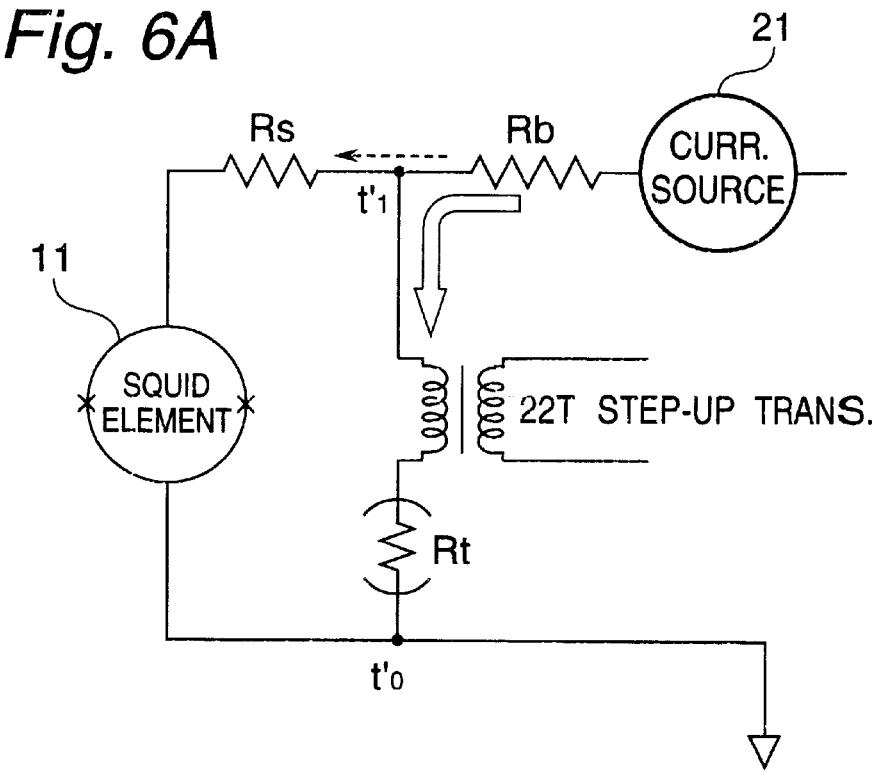
FIGS. 6A and 6B show equivalent circuits to the circuit between a SQUID element and a step-up transformer for explaining the effect of the present invention.
Figure 6B:
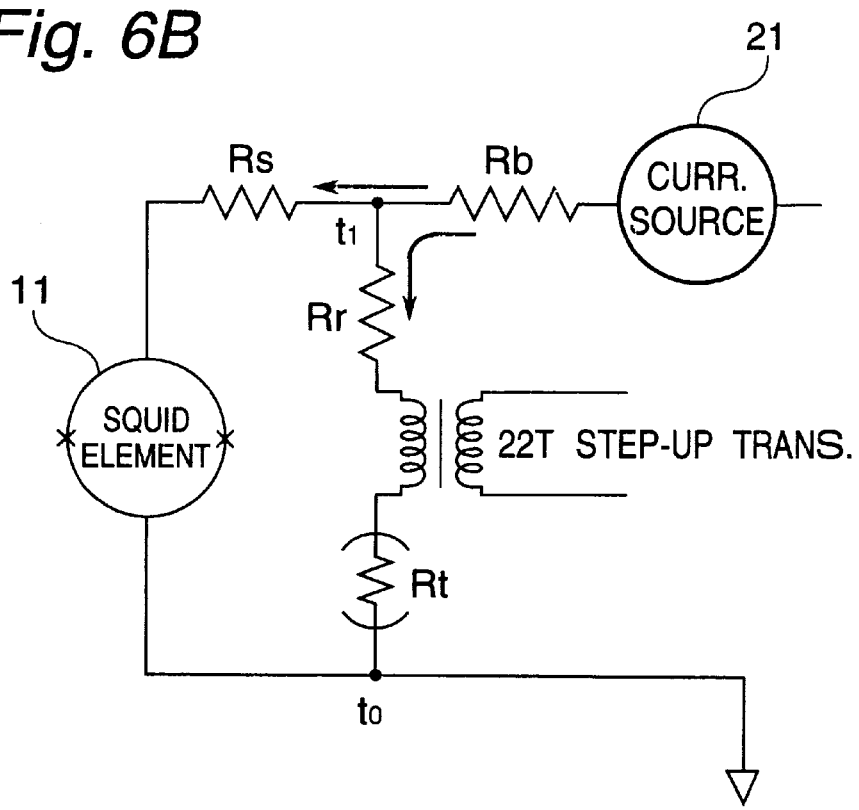

FIGS. 6A and 6B are illustrations for explaining that the voltage step-up circuit constructed in "two terminals manner" according to the present invention is capable of supplying effectively a desired bias current to the SQUID element 11 as well as stepping up effectively the voltage signal detected by the SQUID element 11 to be effectively picked up by the transformer 22T.

In FIG. 6A, there is illustrated an equivalent circuit to the circuit between a SQUID element 11 and a step-up transformer 22T in a circuit, where the type of the circuit is simply changed into "two terminals manner" from "four terminals manner" shown in FIG. 2B, and thereby first terminals $tb_1$ and $td_1$ and second terminals $tb_2$ and $td_2$ are unified to terminals $t'_1$ and $t'_0$, respectively. Additionally, in FIG. 6A and 6B, Rb represents equivalent bias path resistance through a bias current supplying path between the terminals $t'_1$ and $t'_0$, including the sum of internal resistances of the bias current source circuit 21 and the wiring conductor of the path, for example, about 1 kΩ. Rs represents equivalent sensor resistance through the SQUID path between the terminals $t'_1$ and $t'_0$, including internal resistance of the wiring conductor, such as a signal cable between the SQUID sensor 1 and the circuit 2, for example, about 1 to 5 Ω. And, Rt represents equivalent transformer resistance through a transformer path between the terminals $t'_1$ and $t'_0$, including the sum of internal resistances of the set-up transformer 22T and the wiring conductor of the path. This value is almost zero. Consequently, the equivalent transformer resistance Rt is sufficiently smaller than the equivalent sensor resistance Rs.

In the equivalent circuit of FIG. 6A, almost all the current from the current source 21 flows through the transformer path because the transformer resistance Rt is sufficiently smaller than the sensor resistances Rs. As a result, the step-up transformer 22T works in a saturation region of magnetization characteristics curve of the transformer core, and accordingly cannot perform effectively the step up transforming.

Now, referring to FIG. 6B, there is illustrated an equivalent circuit to the circuit between a SQUID element 11 and a step-up transformer 22T in the voltage step-up circuit of the present invention shown in FIG. 5, where Rb, Rs and Rt represent respectively equivalent resistances through the bias current supplying path, the SQUID path and the transformer path except the series resistor 22R between the terminals $t'_1$ and $t'_0$, similarly as FIG. 6A. And, a limitation resistance Rr represents the resistance value of the series resistor inserted in the transformer primary path.

In the equivalent circuit of FIG. 6B, because the limitation resistance Rt is selected so as not to saturate the transformer core as already mentioned, the current flow from the current source 21 is separated suitably to the SQUID clement 11 and the step-up transformer 22T, and accordingly the current through the transformer 22T is not so much as to saturate the transformer 22T. Therefore, the core of the transformer is not saturated by the current that steps up effectively the voltage signal detected by the SQUID element 11.

In addition, for the feedback exciting signal, it may be also adopted that two feedback terminals, such as $tf_1$ and $tf_1$ of FIG. 2B, are separated off from the common potential terminal to in FIG. 5 for technical consideration.

In the case that the common terminal to is used together with the feedback terminal $t_2$ for applying feedback excitation as shown in FIG. 5, the feedback excitation function can be added by providing only three terminal for the whole SQUID sensor 1. Therefore, in this case, the step-up circuit 2 for driving the magnetometric sensor 1 with FLL allows to further increase the effects of reducing the number of wirings and the quantity of a cooling medium.

What is claimed is:

1. A voltage step-up circuit for a magnetometric sensor comprising:

a bias current source for supplying a bias current to a SQUID element used as a magnetometric sensor; and a step-up transformer operating at room temperature for stepping up a voltage signal generated by the SQUID element, wherein said bias current source is electrically connected to two terminals for receiving a voltage signal across the SQUID element;

said step-up transformer is electrically connected through a series resistor between the two terminals; and said series resistor has a resistance that does not saturate the core of said step-up transformer.

2. A voltage step-up circuit as claimed in claim 1 wherein said SQUID element is formed with oxide type of high-temperature superconductor.

3. A voltage step-up circuit as claimed in claim 1 further comprising a third terminal to supply an exciting current together with one of said two terminals to a feedback coil for applying a predetermined magnetic field to said SQUID element.

4. A voltage step-up circuit as claimed in claim 2 further comprising a third terminal to supply an exciting current together with one of said two terminals to a feedback coil for applying a predetermined magnetic field to said SQUID element.

5. A voltage step-up circuit as claimed in claim 1, wherein said bias current is an AC or DC bias current.

6. A voltage step-up circuit as claimed in claim 2, wherein said bias current is an AC or DC bias current.

7. A voltage step-up circuit as claimed in claim 3, wherein said bias current is an AC or DC bias current.

8. A voltage step-up circuit claimed in claim 4, wherein said bias current is an AC or DC bias current.

* * * * *